(12) United States Patent
Hayashida

(10) Patent No.: US 6,707,109 B2
(45) Date of Patent: Mar. 16, 2004

(54) SEMICONDUCTOR INTEGRATED CIRCUIT

(75) Inventor: Yoko Hayashida, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 37 days.

(21) Appl. No.: 09/947,737

(22) Filed: Sep. 6, 2001

(65) Prior Publication Data

US 2002/0017690 A1 Feb. 14, 2002

(30) Foreign Application Priority Data

Sep. 8, 2000 (JP) ........................................ 2000-278686

(51) Int. Cl.$^7$ .............................................. H01L 23/62
(52) U.S. Cl. ..................... 257/355; 257/173; 257/355; 257/356; 257/357; 257/358; 257/360; 257/361; 257/363
(58) Field of Search ............................... 257/355, 356, 257/357, 358, 360, 361, 363, 173; 361/18, 56, 91.1, 111, 118; 327/565

(56) References Cited

U.S. PATENT DOCUMENTS

| 4,922,371 | A | * | 5/1990 | Gray et al. ................... 361/56 |
| 5,721,656 | A | | 2/1998 | Wu et al. |
| 5,745,323 | A | * | 4/1998 | English et al. ................ 361/56 |
| 5,804,861 | A | * | 9/1998 | Leach ........................ 257/362 |
| 5,852,541 | A | * | 12/1998 | Lin et al. .................... 361/111 |
| 5,936,282 | A | * | 8/1999 | Baba et al. ................... 257/355 |
| 5,945,713 | A | * | 8/1999 | Voldman ..................... 257/355 |
| 6,060,752 | A | * | 5/2000 | Williams ..................... 257/355 |
| 6,144,542 | A | * | 11/2000 | Ker et al. .................... 361/111 |
| 6,249,410 | B1 | * | 6/2001 | Ker et al. ..................... 361/56 |
| 6,373,104 | B1 | * | 4/2002 | Smith ......................... 257/355 |
| 6,399,990 | B1 | * | 6/2002 | Brennan et al. ............. 257/355 |
| 6,452,766 | B1 | * | 9/2002 | Carper ........................ 361/18 |
| 2002/0014665 | A1 | * | 2/2002 | Lee et al. .................... 257/355 |
| 2002/0079927 | A1 | * | 6/2002 | Katoh et al. ................. 326/86 |

FOREIGN PATENT DOCUMENTS

| JP | 2001332695 A | * | 11/2001 | ........... H01L/27/04 |
| JP | 2001332696 A | * | 11/2001 | ........... H01L/27/04 |

* cited by examiner

Primary Examiner—Amir Zarabia
Assistant Examiner—Ida M. Soward
(74) Attorney, Agent, or Firm—Darryl G. Walker; Bradley T. Sako

(57) ABSTRACT

A semiconductor device having resistance to static electricity damage under the CDM is disclosed. The semiconductor device may include a plurality of input/output terminals (102), a first reference electric potential connection (101) electrically connected to the terminals, an input/output protection element (103) electrically connected between the terminals and the first reference electric potential connection (101). A board electric potential generator (104) may provide a potential to a board electric potential connection. A clamp element (105) may be electrically connected between the first reference electric potential and the board electric potential connection.

24 Claims, 10 Drawing Sheets

SEMICONDUCTOR INTEGRATED CIRCUIT

TECHNICAL FIELD

The present invention relates generally to a semiconductor integrated circuit device and more specifically to a semiconductor integrated circuit device that prevents damage caused by electrostatic discharge from a charged device model (CDM).

BACKGROUND OF THE INVENTION

As semiconductor device features become finer and the integration of such devices increases, an important concern can be electrostatic discharge (ESD). Electrostatic discharge can result when a static electricity, or the like, is discharged into or from a semiconductor device. ESD may result in damage to a semiconductor device, causing such a device to immediately fail, or have decreased reliability. One particular failure mechanism can be a breakdown of the gate dielectric in an insulated gate field effect transistor (IGFET), such as the gate oxide of a metal-oxide-semiconductor (MOS) FET.

ESD is believed to occur at various stages in a manufacturing process when semiconductor devices are handled and transported, for example.

Various models of the ESD breakdown phenomenon have been proposed, including a human body model (Human Body Model: HBM), a machine model (Machine Model: MM), and a charged device model (Charged Device Model: CDM).

In the HBM, electric charges are generated, and then discharged to a device when a charged human makes contact with the device. In the MM, electric charges are generated on a metal instrument, or the like, and then discharged to a semiconductor device when the instrument and device contact one another. In general, such a metal instrument can have a larger electrostatic capacitance than a human body, but also have a lower discharge resistance than a human body. In the HBM and the MM, the static electricity is applied to or discharged from two specific terminals of the device.

The theory of damage caused by static electricity in the CDM will now be explained.

Referring now to FIG. 6, an internal circuit structure of a conventional semiconductor integrated circuit is set forth. A terminal of the semiconductor integrated circuit 114 is connected to a gate of a MOS transistor 112 in the internal circuit. A static electricity protection element 103 is connected between a terminal 102 and a reference electric potential connection 101. Generally, reference potential connection 101 is a circuit board electric potential connection which differs from a ground (GND) electric potential connection and has a potential different from a GND electric potential.

Static electricity protection element 103 prevents damage to MOS transistor 112 which may be caused by the application of static electricity to terminal 102. Static electricity protection element 103 provides protection against damage under the human body model (HBM) and machine model (MM).

A capacitance 113 is connected between the chip and ground. Capacitance 113 indicates an equivalent capacitance between the chip and ground in a CDM test which charges the test device and then discharges the electric charge from a specific terminal connected to ground. In this way, the electric charge of the charged chip is stored. Terminal 102 is connected to ground through a CDM test switch 115. The eclectic charge of the device (the entire electric charge of the chip) is discharged from terminal 102 through reference electric potential connection 101 and static electricity element 103 to ground.

At that time, electric charge stored at the gate of MOS transistor 112 connected to terminal 102 is also discharged to ground. The electric charge stored at the gate of MOS transistor 112 is significantly smaller than that discharged from reference electric potential connection 101 and is thus discharged in a short time.

As a result, the difference in electric potential occurring between the source and gate of MOS transistor 112 increased and the gate insulation (oxide) can be damaged. To prevent this damage under the CDM, a protection element 116 is provided close to and between the gate and source of MOS transistor 112. This technique is disclosed in "Electrical Overstress/Electrostatic Discharge Symposium Proceeding", Sep. 27–29, 1988, pp. 220–227.

Referring now to FIG. 7, a conventional ESD protection technique is set forth in a block schematic diagram. The conventional ESD protection technique employs a board electric potential connection as the reference potential connection 101 and sets the board electric potential connection 101 to the ground electric potential. Static electricity protection elements 103 are connected to a VCC terminal, an input terminal, and an I/O terminal. Each static electricity protection element 103 is the same as static electricity protection element 103 illustrated in FIG. 6. In FIG. 7, the internal circuit elements and the CDM protection element which are connected to the input terminal are omitted to avoid unduly cluttering the figure. Because the board electric potential connection 101 is connected to the semiconductor board at a number of connections, the electric charge stored in the board can be discharged through the board electric potential connection 101 (reference electric potential connection), protection element 103, and one test terminal (can be any of terminals 102) to ground. Thus, protection elements 103 may prevent damage.

Referring now to FIG. 8, the conventional ESD protection technique of FIG. 7 is set forth in a block schematic diagram illustrating the connection of a board electric potential generating circuit 104. The configuration of FIG. 8 is similar to FIG. 7 in that terminals 102 are connected to the board electric potential connection 101 through the static protection elements 103. Also illustrated is a board electric potential generating circuit 104 connected to the board electric potential connection 101 to generate the board electric potential. Likewise, the electric charge stored in the chip is discharged through the board electric potential connection 101, protection element 103, and one test terminal (can be any of terminals 102) to ground. Thus, protection elements 103 may prevent damage.

This type of conventional technique is disclosed in Japanese Unexamined Patent Application, First publication No. 3-72666 (JPA 3-72666). In JPA 3-72666, static electric pulses applied to terminals are discharged through a plurality of protection elements, an electric power connection, and a reference electric potential connection. Japanese Patent No. 2,848,674 discloses a single connection, which connects terminals through the protection element. Japanese Patent No. 2,972,494 discloses a single connection, which connects the terminals through the protection element. Thus, charge is allowed to discharge in either direction between two terminals depending on the application of either a positive or negative voltage.

Japanese Patent No. 2,910,474 discloses a protection element between an internal power source connection and a reference electric potential connection to a circuit for increasing or decreasing an internal power voltage.

In these publications, the protection element is provided between the input/output terminal and the reference electric potential connection or between the power source connections at different electric potentials.

Referring now to FIG. 9, a conventional ESD protection technique is set forth in a block schematic diagram. In the semiconductor integrated circuit illustrated in FIG. 9, the reference electric potential connection 101 is connected to the ground potential. In this case the board electric potential generating circuit 104 is connected to the board electric potential connection 106 and there is no path for discharging the charge stored in the board in the CDM test, thereby decreasing the CDM tolerance.

The above-mentioned publications disclose static electricity protection elements as shown in FIG. 9 and disclose different structures related to the reference electric potential connection 101 and board electric potential connection 106. In the structures disclosed, the charge stored in the board in the CDM test cannot be discharged and the tolerance under the CDM is decreased.

In light of the above discussion, it would be desirable to provide a semiconductor integrated circuit, which may prevent damage caused by static electricity under the CDM.

SUMMARY OF THE INVENTION

According to the embodiments of the present invention, a semiconductor device that can have resistance to static electricity damage under the CDM (Charged Device Model) is disclosed. The semiconductor device may include a plurality of input/output terminals. A first reference electric potential connection may be electrically connected to the terminals. An input/output protection element may be electrically connected between the terminals and the first reference electric potential connection. A board electric potential generator may provide a potential to a board electric potential connection. A clamp element may be electrically connected between the first reference electric potential and the board electric potential connection.

According to one aspect of the embodiments, a semiconductor device may include a plurality of input/output terminals and a first reference electric potential connection. An input/output protection element may be electrically connected between each input/output terminal and the first reference electric potential connection. A board electric potential generator may be electrically connected to a board electric potential connection. A clamp element may be electrically connected between the first reference electric potential connection and the board electric potential connection.

According to another aspect of the embodiments, a semiconductor device may include a plurality of input/output terminals. An input/output protection element may be electrically connected between each input/output terminal and a supply connection. A board electric potential connection may be electrically connected to a board electric potential generator. A clamp element may be electrically connected between the supply connection and the board electric potential connection.

According to another aspect of the embodiments, a semiconductor device may include a second conductive well formed on a semiconductor substrate. A first conductive well may be formed in the second conductive well. An input/output protection element may be electrically connected between at least one of the input/output terminals and a second reference electric potential connection. The input/output protection element may be provided within the first conductive well. A board electric potential connection may be electrically connected to a board electric potential generator. A clamp element may be electrically connected between the board electric potential connection and the second reference electric potential connection.

According to another aspect of the embodiments, the clamp element may include a parasitic bipolar element, a thryristor, a diode or an insulated gate field effect transistor (IGFET).

According to another aspect of the embodiments, the input/output protection element and the clamp element may discharge current in bi-directions.

According to another aspect of the embodiments, the input output protection element and the clamp element may have the same structure and size.

According to another aspect of the embodiments, at least two clamp elements may be provided in a semiconductor substrate.

According to another aspect of the embodiments, the clamp elements may be essentially evenly distributed in the semiconductor substrate.

According to another aspect of the embodiments, no other circuit element other than the clamp element and the board electric potential generator may be connected to the board electric potential connection.

According to another aspect of the embodiments, the reference electric potential connection may be a ground connection.

According to another aspect of the embodiments, the electric potential of the board electric potential connection may be lower than that of the first reference electric potential connection.

According to another aspect of the embodiments, the second electric potential connection may be electrically connected to the first conductive well.

DETAILED DESCRIPTION OF THE EMBODIMENTS

Various embodiments of the present invention will now be described in detail with reference to a number of drawings.

First Embodiment

Figure 1:
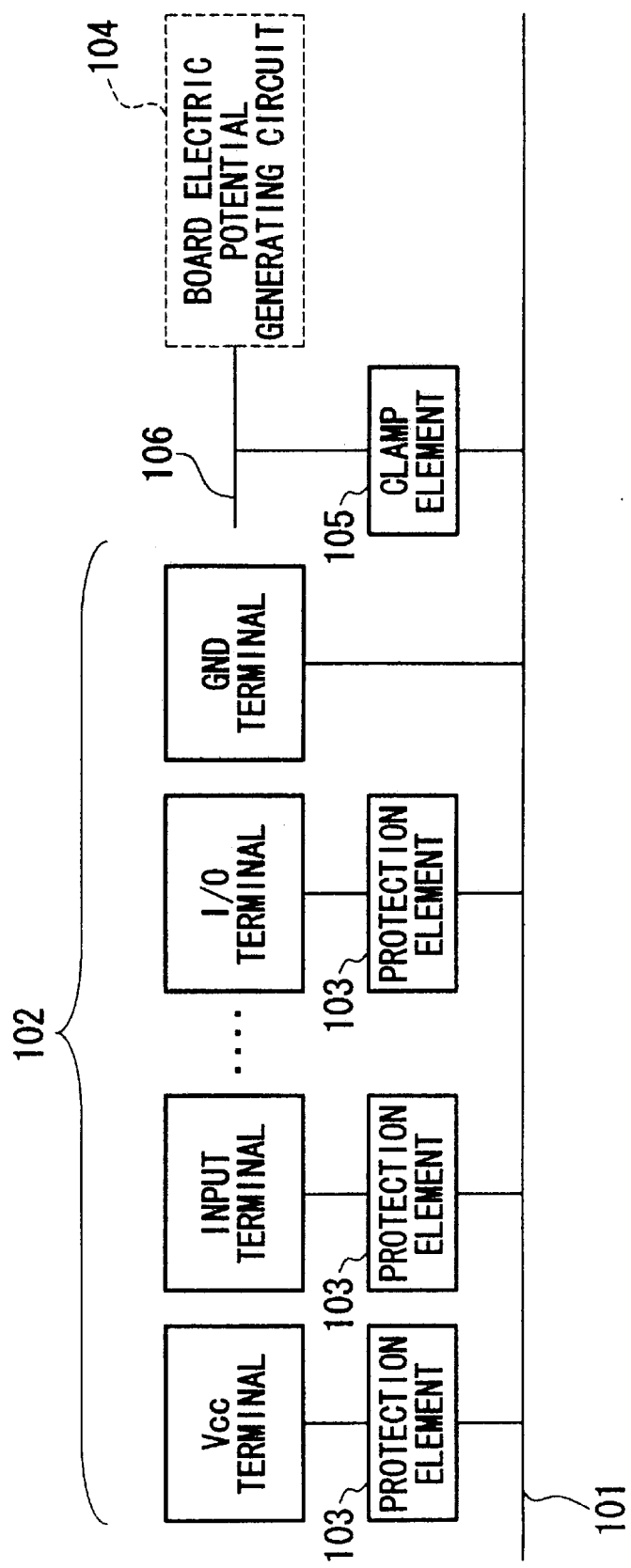
FIG. 1 is a block schematic diagram of a semiconductor integrated circuit according to a first embodiment.

Referring now to FIG. 1, a block schematic diagram of a semiconductor integrated circuit according to a first embodiment is set forth.

In FIG. 1, static electricity protection elements 103 may be connected between a reference electric potential connection (GND) 101 and terminals 102 (i.e. Vcc, Input, I/O, etc.). A clamp element 105 may be connected between a board electric potential connection 106 and the reference electric potential connection 101. The board electric potential connection 106 may be an output from a board electric potential generating circuit 104. No internal circuit element other than circuit elements, which may constitute clamp element 105 and board electric potential generating circuit 104, may be connected to the board electric potential connection 106.

In FIG. 1, the internal circuit elements connected to input terminal 102 and CDM protection are omitted to avoid unduly cluttering the figure. According to this structure, the charge stored in the board may be discharged through clamp element 105, board electric potential connection 106, protection element 103, and terminal 102 to ground. Thus, the CDM tolerance may be increased.

Charge stored in the board may result in current flowing through clamp element 105 toward ground or current flowing through clamp element from ground. In other words, clamp element 105 may discharge current in bidirections, depending on the potential of the board with respect to ground.

Figure 2:
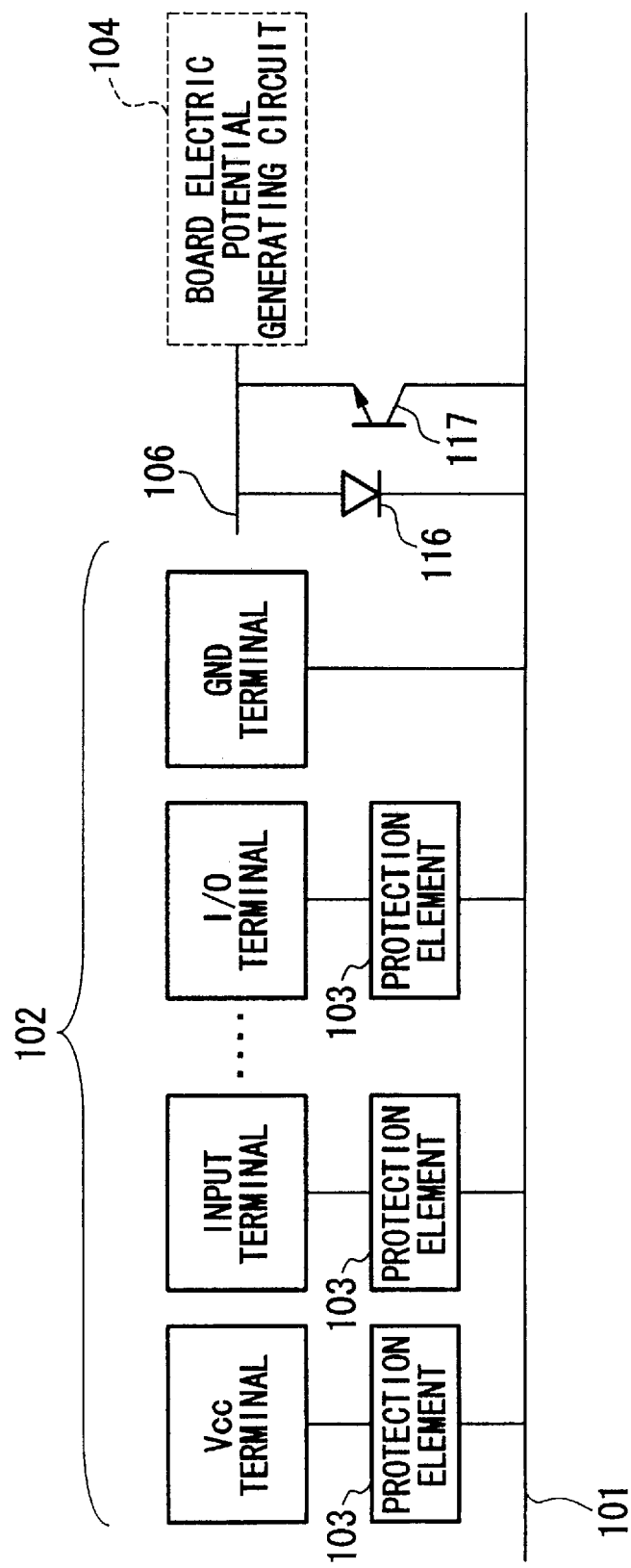
FIG. 2 is a schematic diagram of a semiconductor integrated circuit according to the first embodiment.

Referring now to FIG. 2, a schematic diagram of a semiconductor integrated circuit according to the first embodiment is set forth.

In FIG. 2, clamp element 105 connected between board electric potential connection 106 and reference electric potential may include an NPN parasitic bipolar element 117 and a diode 116. Clamp element 105 may have the same structure and size as that of static electricity protection elements 103 illustrated in FIG. 1. That is, static electricity protection elements 103 may each have an NPN parasitic bipolar element and a diode that can be equivalent to NPN parasitic bipolar element 117 and diode 116 used in clamp element 105.

According to an experiment carried out by the inventor, in the conventional structure having no clamp element between the board electric potential connection 106 and the reference electric potential connection 101, the CDM tolerance is approximately 700 to 1000V. However, the structure of the present invention may provide a CDM tolerance of approximately 1200 to 1500V. Thus, the static electricity tolerance may be increased by approximately 500V.

When clamp element 105 includes a thyristor (semiconductor-controlled rectifier or SCR), or a MOSFET, or when a plurality of clamp elements are used, the same effect may be achieved. The board electric potential generating circuit 104 may output a potential onto the board electric potential connection 106 which is at a lower electric potential than the reference electric potential connection 101. The reference electric potential connection 101 may be at a GND potential. The structure of the present invention may be used in a dynamic random access memory (DRAM), as just one example.

Second Embodiment

Figure 3:
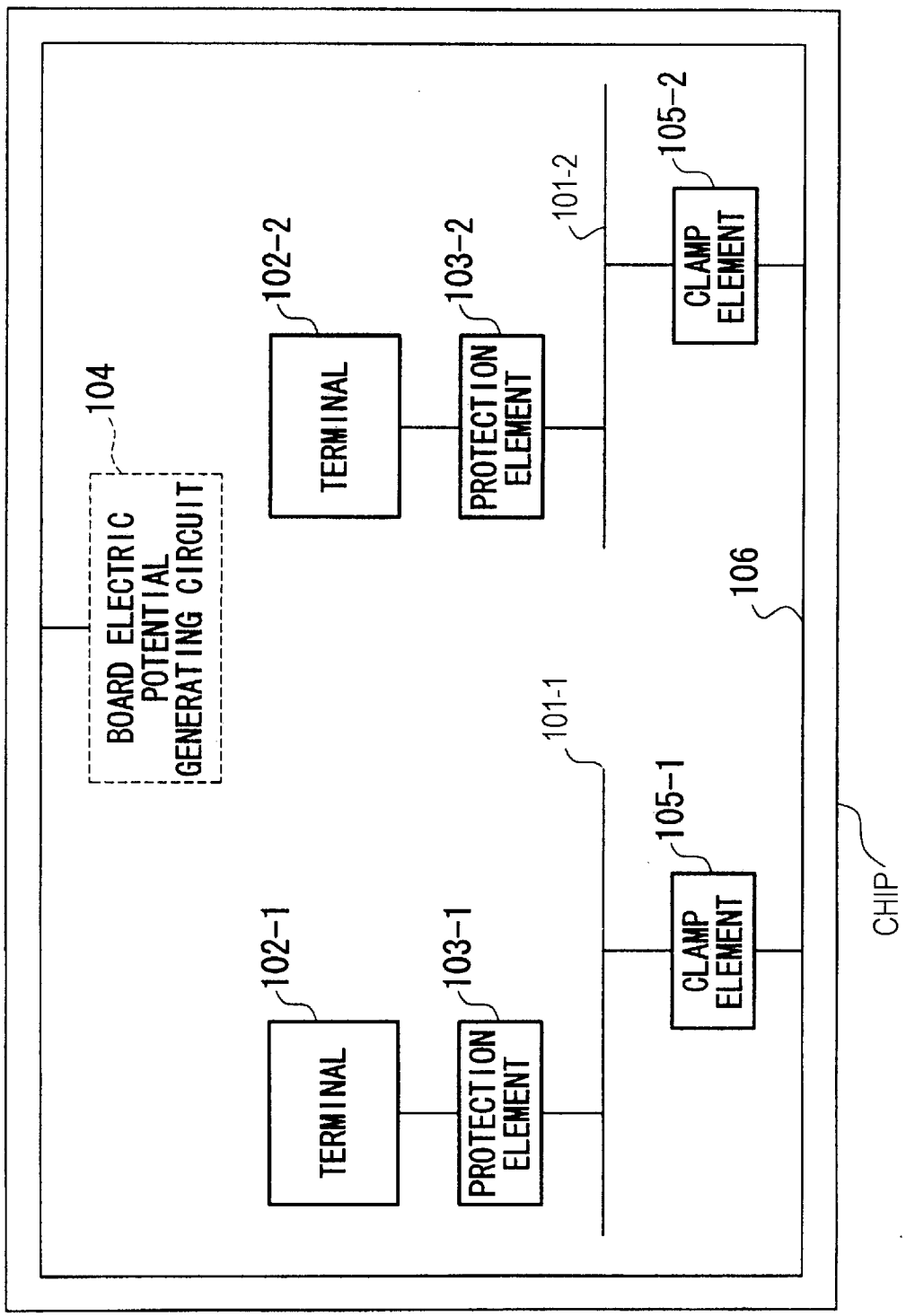
FIG. 3 is a block schematic diagram of a semiconductor integrated circuit according to the second embodiment illustrating the arrangement of a plurality of clamp elements.

A second embodiment of the present invention will now be explained. Referring to FIG. 3, a block schematic diagram of a semiconductor integrated circuit according to a second embodiment is set forth. In FIG. 3, static electricity protection elements (103-1 and 103-2) may be respectively connected between terminals (102-1 and 102-2) and independent reference electric potential connections (101-1 and 101-2). Independent reference electric potential connections (101-1 and 101-2) may respectively serve as a ground (GND). Board electric potential generating circuit 104 may provide a potential at a board electric potential connection 106. Clamp elements (105-1 and 105-2) may be respectively connected between board electric potential connection 106 and independent reference electric potential connections (101-1 and 101-2).

The charge stored in the board may be discharged though the board electric potential connection 106, clamp elements (105-1 and 105-2), reference electric potential connections (101-1 and 101-2), static electricity protection elements (103-1 and 103-2), and terminals (102-1 and 102-2) to ground. In this way electricity may be discharged between either terminal (102-1 or 102-2). The ESD tolerance may not be dependent on which terminal (102-1 or 102-2) provides the discharge path.

Figure 4:
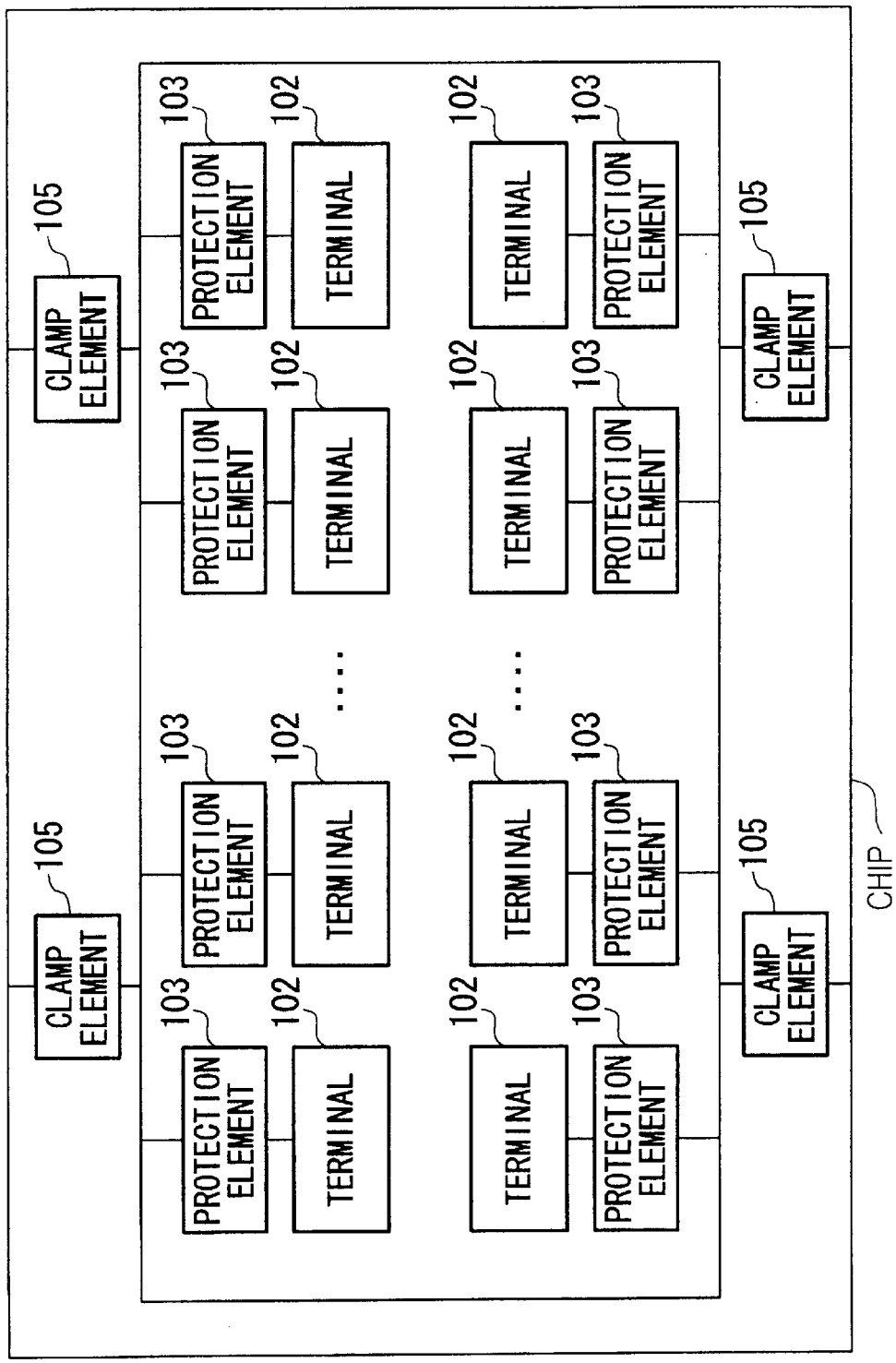
FIG. 4 is a circuit schematic diagram of internal power supply circuit according to the first embodiment.
Figure 10:
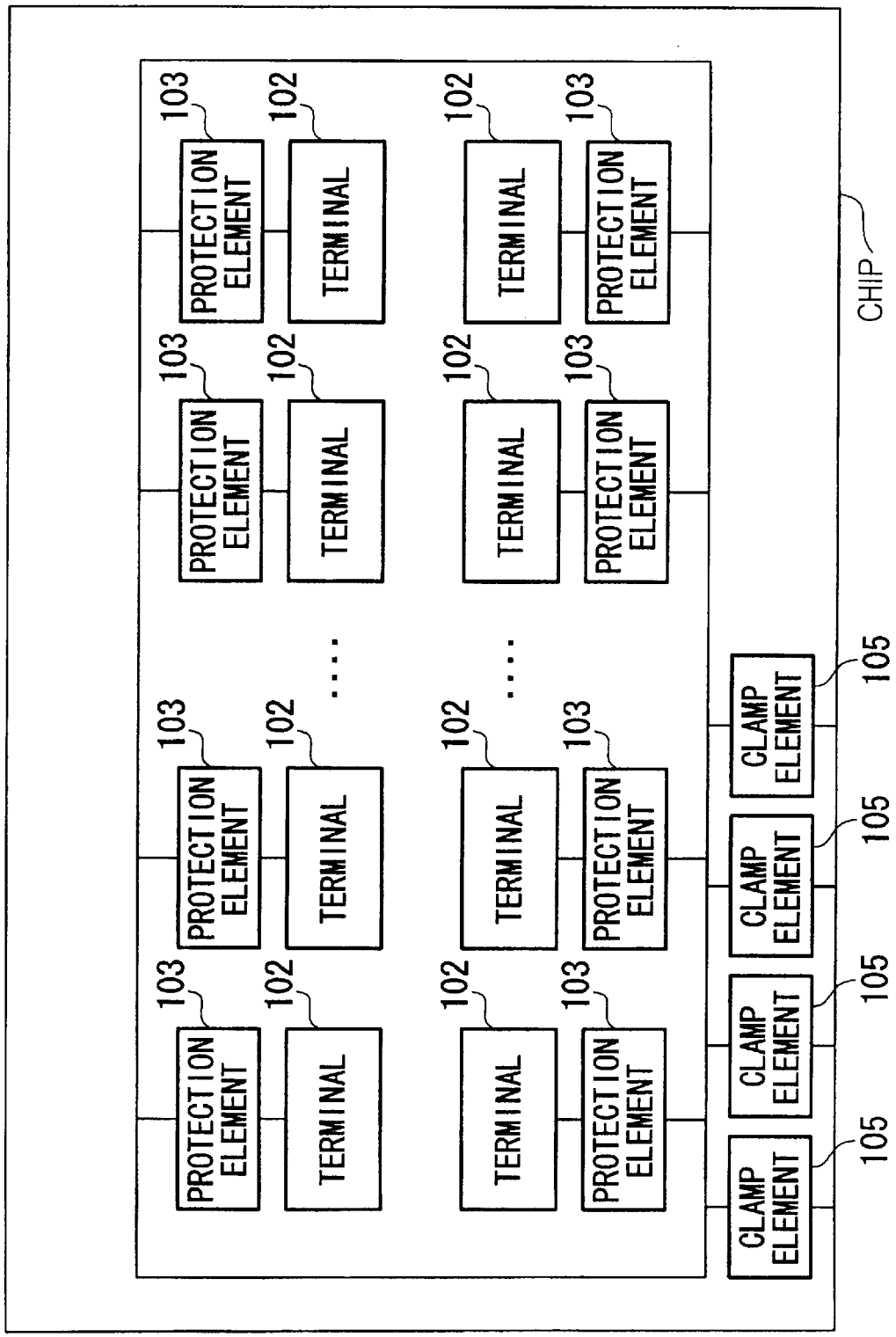
FIG. 10 is a block schematic diagram illustrating a ESD protection technique where clamp elements are not evenly distributed.

Referring now to FIG. 4, a block schematic diagram of a semiconductor integrated circuit according to the second embodiment illustrating the arrangement of a plurality of clamp elements is set forth. When a plurality of clamp elements 105 is provided, the clamp elements should be evenly distributed on the chip. When clamp elements 105 are unevenly distributed on the chip, the charge in the area in which no clamp element 105 is provided may not be properly discharged. FIG. 10 can illustrate a case in which clamp elements 105 are not evenly distributed.

Third Embodiment

Figure 5:
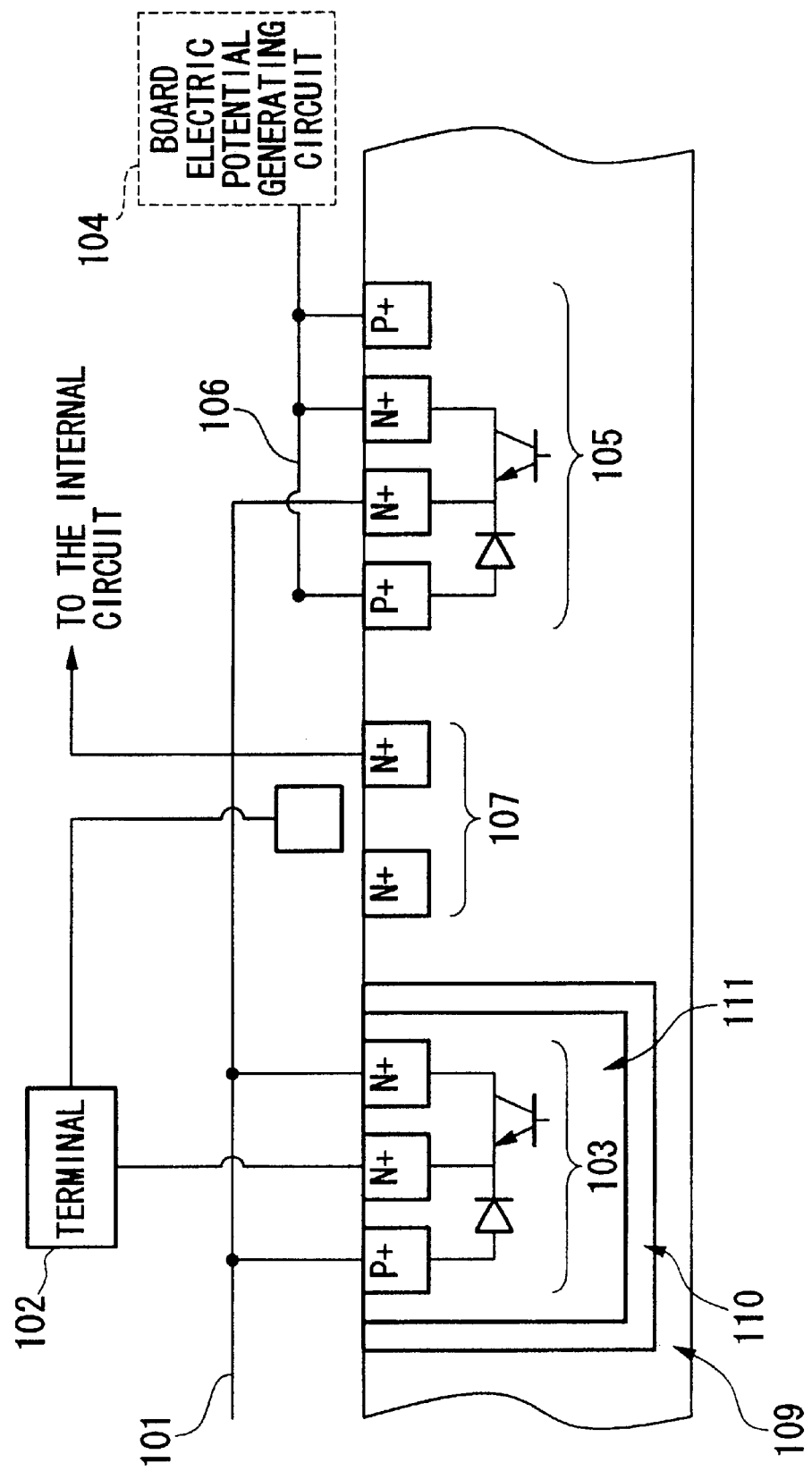
FIG. 5 is a cross-sectional diagram of a semiconductor integrated circuit according to a third embodiment.
Figure 6:
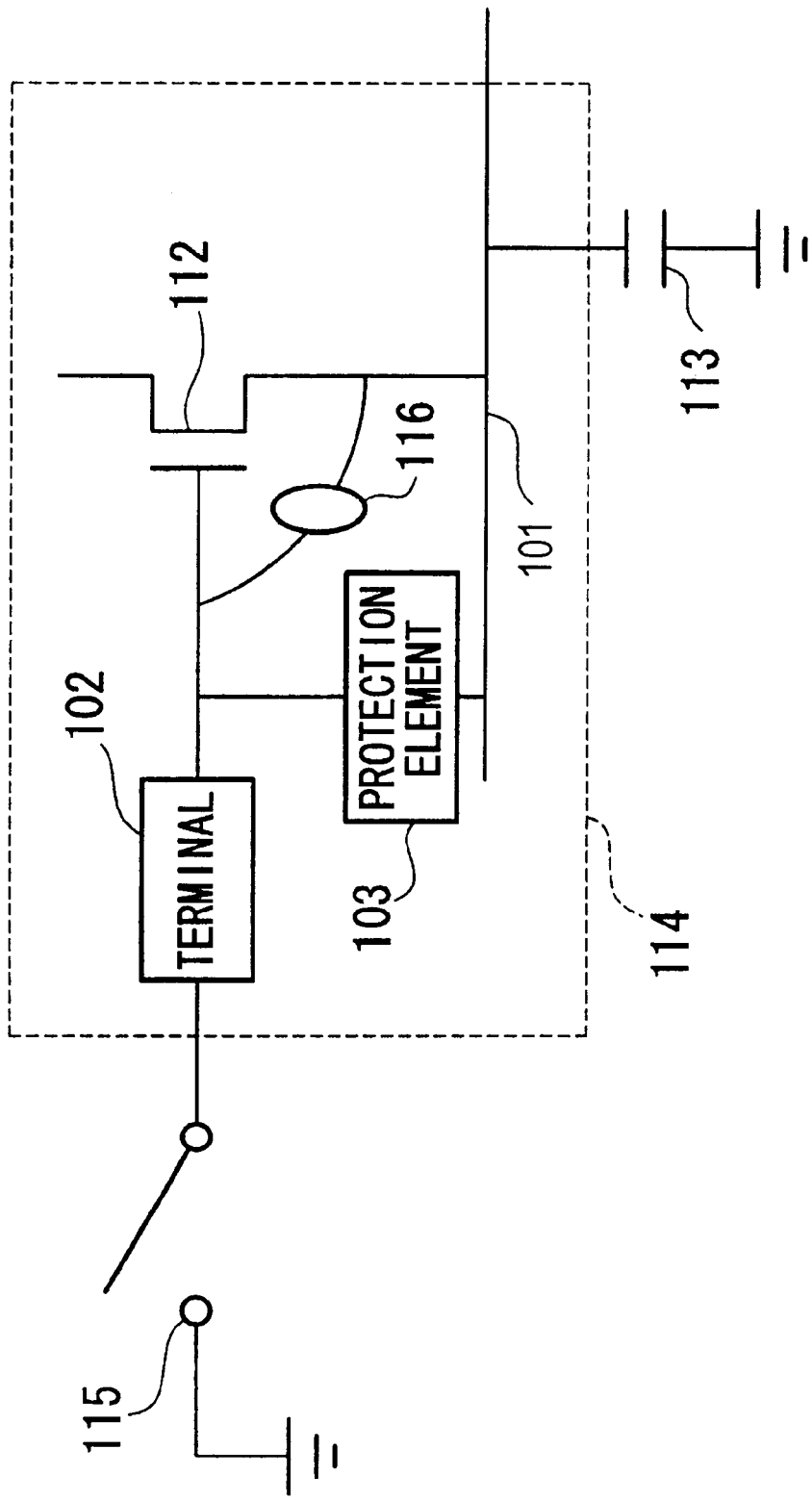
FIG. 6 is an internal circuit structure of a conventional semiconductor integrated circuit.
Figure 7:
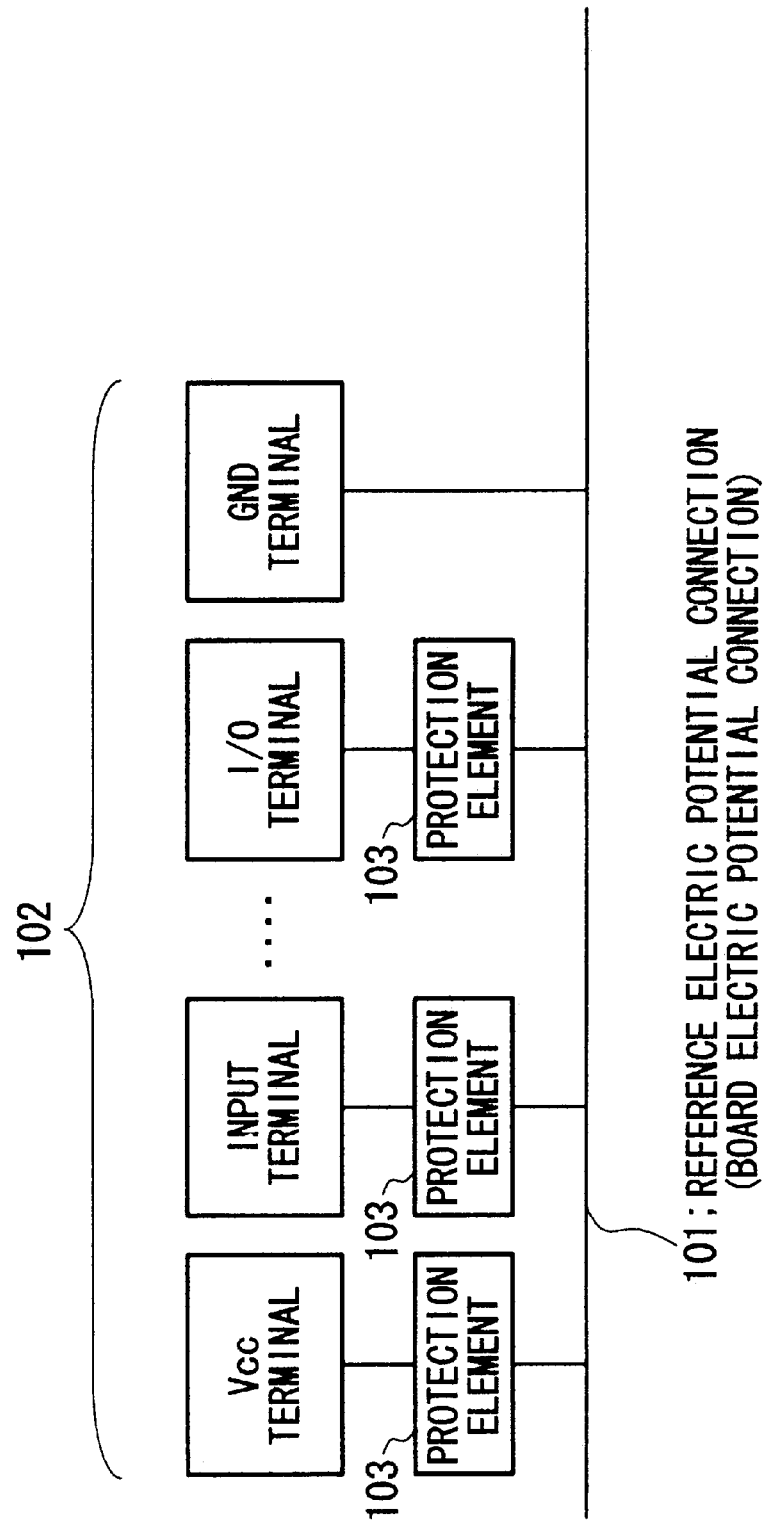
FIG. 7 is a block schematic diagram illustrating a conventional ESD protection technique.
Figure 8:
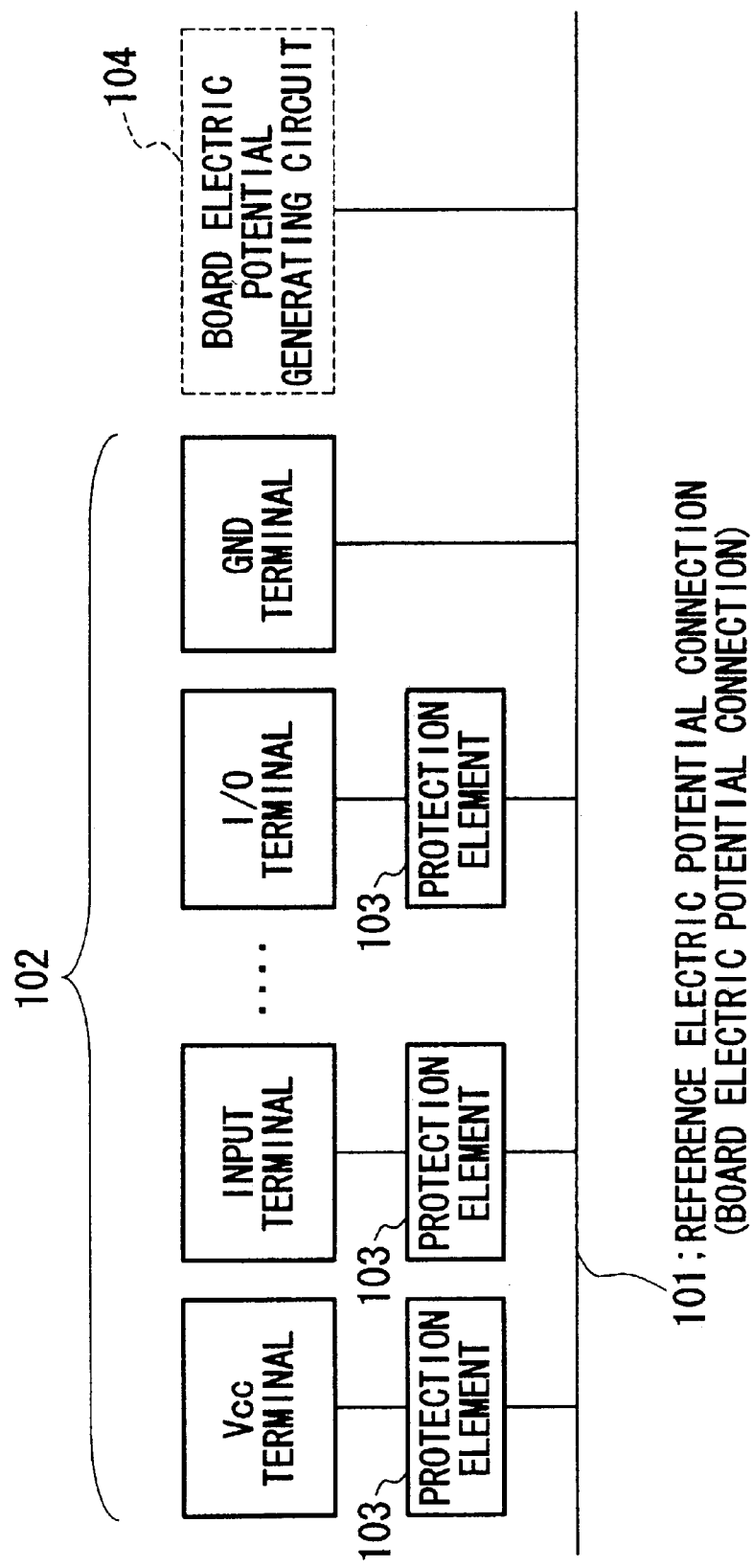
FIG. 8 is a block schematic diagram illustrating the connection of a board electric potential generating circuit in a conventional ESD protection technique.
Figure 9:
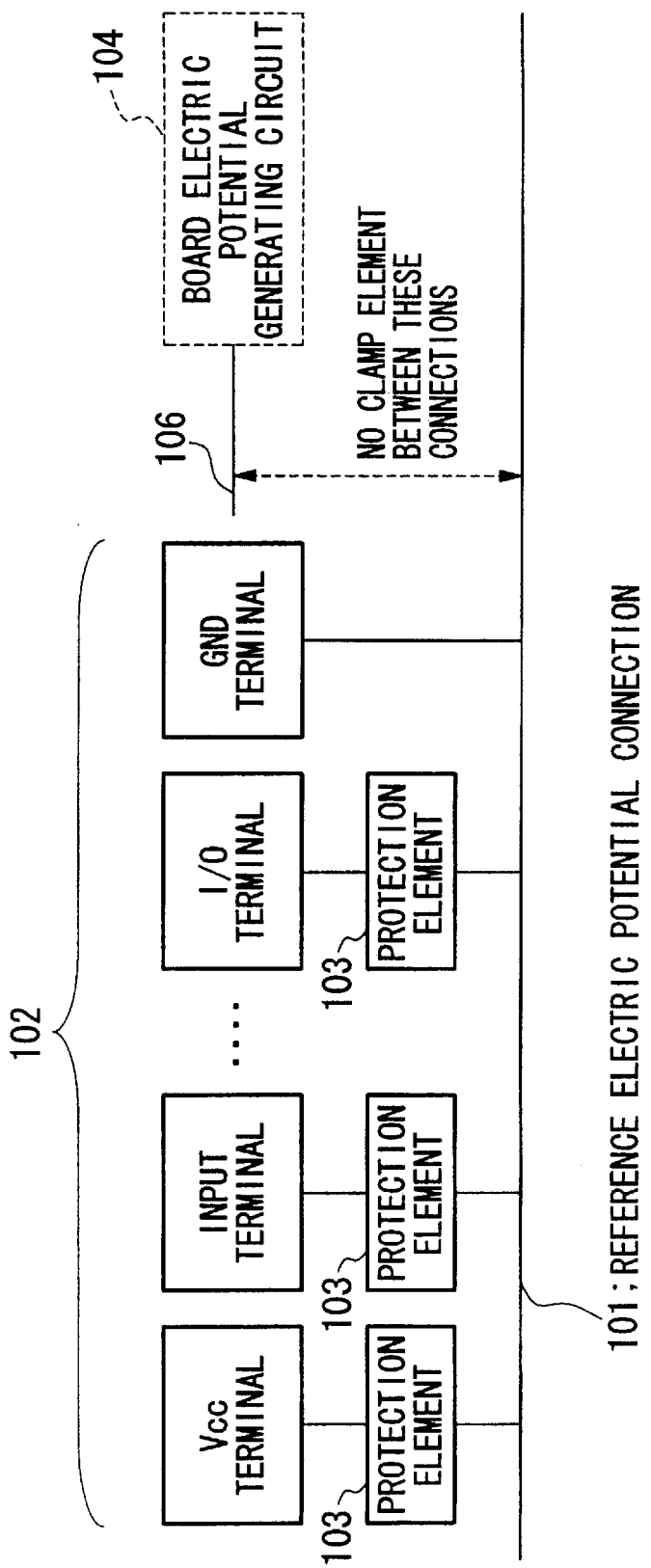
FIG. 9 is a block schematic diagram illustrating a conventional ESD protection technique.

A third embodiment of the present invention will now be explained. Referring now to FIG. 5, a cross-sectional diagram of a semiconductor integrated circuit according to a third embodiment is set forth. In FIG. 5, the semiconductor integrated circuit may include a static protection element 103. Static protection element 103 may include a diode and NPN parastic bipolar element. Static protection element 103 may be formed in a p-well 111. P-well 111 may be formed in a deep n-well 110 on a p-type semiconductor substrate 109. Static electric protection element 103 may be electrically connected between a terminal 102 and a reference electric potential connection 101.

P-well 111 may be electrically connected to reference electric potential 101. A clamp element 105 may be provided between a board electric potential connection 106 and a reference electric potential connection 101. Clamp element 105 may include a diode and a NPN parasitic bipolar element. A board electric potential generating circuit 104 may provide a potential on board electric potential connection 106.

The charge stored in the board may be discharged though clamp element 105, reference electric potential connection 101, static electricity protection element 103 and terminal 102 to ground. Clamp element 105 may have the same structure and size as protection element 103.

If clamp element 105 is not provided, the charge stored in p-well 111 may be drawn through terminal 102. In this way, the gate of an internal circuit transistor 107 may be immediately discharged to the ground level, while the electric potential of the board in the vicinity of transistor 107 may not be immediately discharged to the ground level. Thus, the gate oxide film may be damaged. However, by providing clamp element 105, the present invention may prevent damage to the oxide film. Clamp element 105 may include a thyristor (SCR), or a MOSFET and the same effect may be achieved.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
    a plurality of input/output terminals;
    a first reference electric potential connection;
    an input/output protection element electrically connected between each input/output terminal and the first reference electric potential connection
    a board electric potential connection coupled to receive a potential from a board electric potential generator; and
    a clamp element electrically connected between the first reference electric potential connection and the board electric potential connection.

2. The semiconductor device of claim 1, wherein the clamp element includes at least one of the group consisting of a parasitic bipolar element, a thyristor, a diode, and an insulated gate field effect transistor (IGFET).

3. The semiconductor device of claim 1, wherein the input/output protection element and the clamp element can discharge current in bi-directions.

4. The semiconductor device of claim 3, wherein:
    the input/output protection element and the clamp element have the same structure and size.

5. The semiconductor device of claim 1, wherein at least two clamp elements are provided in a semiconductor substrate.

6. The semiconductor device of claim 5, wherein the clamp elements are essentially evenly distributed in the semiconductor substrate.

7. The semiconductor device of claim 1, wherein no other circuit element other than the clamp element and the board electric potential generator is connected to the board electric potential connection.

8. The semiconductor device of claim 1, wherein the first reference electric potential connection is a ground connection.

9. The semiconductor device of claim 1, wherein the electric potential of the board electric potential connection is lower than that of the first reference electric potential connection.

10. A semiconductor device, comprising:
    a plurality of input/output terminals;
    an input/output protection element electrically connected between each input/output terminal and a supply connection;
    a board electric potential connection coupled to receive a potential from a board electric potential generator; and
    a clamp element electrically connected between the supply connection and the board electric potential connection.

11. The semiconductor device of claim 10, wherein the clamp element includes at least one of the group consisting of a parasitic bipolar element, a thyristor, a diode, and an insulated gate field effect transistor (IGFET).

12. The semiconductor device of claim 10, wherein the input/output protection element and the clamp element can discharge current in bi-directions.

13. The semiconductor device of claim 10, wherein the input/output protection element and the clamp element have the same structure and size.

14. The semiconductor device of claim 10, wherein at least two clamp elements are provided in a semiconductor substrate.

15. The semiconductor device of claim 14, wherein the clamp elements are essentially evenly distributed in the semiconductor substrate.

16. The semiconductor device of claim 10, wherein no other circuit element other than the clamp element and the board electric potential generator is connected to the board electric potential connection.

17. A semiconductor device, comprising:
    a second conductive well formed on a semiconductor substrate;
    a first conductive well formed in the second conductive well;
    a plurality of input/output terminals;
    a second reference potential connection;
    an input/output protection element electrically connected between at least one of the input/output terminals and the second reference electric potential connection, the input/output protection element being provided within the first conductive well;
    a board electric potential connection coupled to receive a potential from a board electric potential generator; and
    a clamp element electrically connected between the board electric potential connection and the second reference electric potential connection.

18. The semiconductor device of claim 17, wherein the clamp element includes at least one of the group consisting of a parasitic bipolar element, a thyristor, a diode, and an insulated gate field effect transistor (IGFET).

19. The semiconductor device of claim 17, wherein the input/output protection element and the clamp element can discharge current in bi-directions.

20. The semiconductor device of claim 17, wherein the input/output protection element and the clamp element have the same structure and size.

21. The semiconductor device of claim 17, wherein at least two clamp elements are provided in a semiconductor substrate.

22. The semiconductor device of claim 21, wherein the clamp elements are essentially evenly distributed in the semiconductor substrate.

23. The semiconductor device of claim 17, wherein no other circuit element other than the clamp element and the board electric potential generator is connected to the board electric potential connection.

24. The semiconductor device of claim 17, wherein the second electric potential connection is electrically connected to the first conductive well.

* * * * *